United States Patent
Smetana, Jr.

(10) Patent No.: US 7,337,537 B1
(45) Date of Patent: Mar. 4, 2008

(54) METHOD FOR FORMING A BACK-DRILLED PLATED THROUGH HOLE IN A PRINTED CIRCUIT BOARD AND THE RESULTING PRINTED CIRCUIT BOARD

(75) Inventor: Joseph Smetana, Jr., Rockwall, TX (US)

(73) Assignee: Alcatel Lucent, Paris (FR)

( * ) Notice: Subject to any disclaimer, the term of this patent is extended or adjusted under 35 U.S.C. 154(b) by 186 days.

(21) Appl. No.: 11/354,526

(22) Filed: Feb. 15, 2006

Related U.S. Application Data

(62) Division of application No. 10/667,631, filed on Sep. 22, 2003, now abandoned.

(51) Int. Cl.
   *H01K 3/10* (2006.01)

(52) U.S. Cl. .......... 29/852; 29/846; 427/97.1; 427/97.2

(58) Field of Classification Search .......... 29/825, 29/846, 852; 427/97.1, 97.2
See application file for complete search history.

(56) References Cited

U.S. PATENT DOCUMENTS

| | | | | |
|---|---|---|---|---|
| 4,543,715 A | * | 10/1985 | Iadarola et al. | 29/852 |
| 5,576,519 A | * | 11/1996 | Swamy | 174/265 |
| 6,722,031 B2 | * | 4/2004 | Japp et al. | 29/852 |
| 6,802,120 B2 | * | 10/2004 | Uehara | 29/852 |

* cited by examiner

*Primary Examiner*—Carl J. Arbes
(74) *Attorney, Agent, or Firm*—Bobby D. Slaton

(57) ABSTRACT

A method for forming a back-drilled plated through hole in a printed circuit board and the resulting printed circuit board are described herein. In the preferred embodiment, the printed circuit board includes a via extending through a plurality of stacked layers. The via includes a plated through hole and a back-drilled hole. The plated through hole is located within a predetermined number of the stacked layers and the back-drilled hole is located within the remaining stacked layer(s). The plated through hole without an electrically conductive material located on walls therein has a diameter that is substantially the same size or smaller than the diameter of the back-drilled hole.

4 Claims, 3 Drawing Sheets

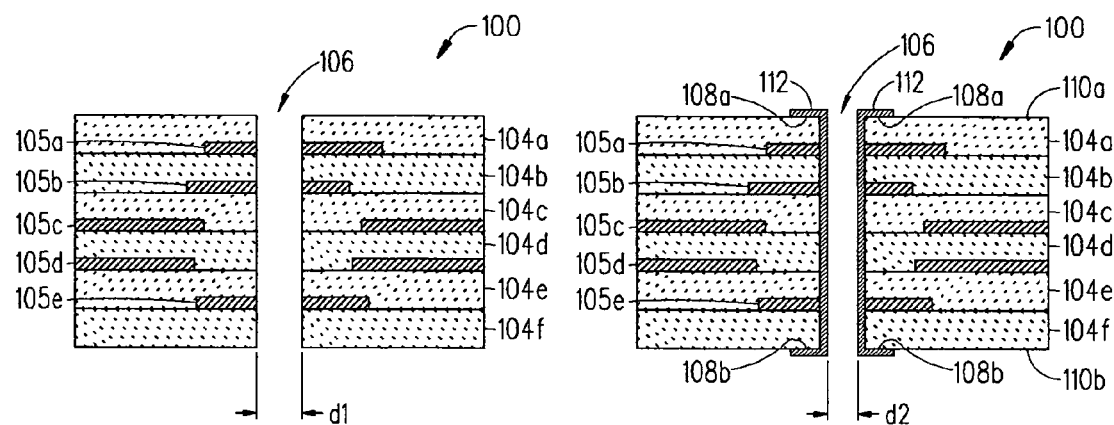
FIG. 1A
(PRIOR ART)
FIG. 1B
(PRIOR ART)
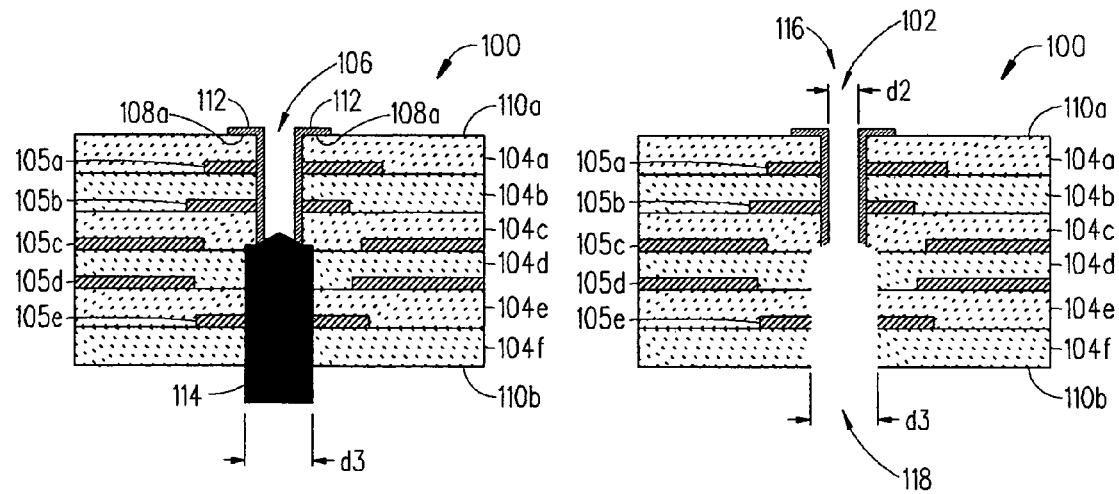
FIG. 1C
(PRIOR ART)
FIG. 1D
(PRIOR ART)

METHOD FOR FORMING A BACK-DRILLED PLATED THROUGH HOLE IN A PRINTED CIRCUIT BOARD AND THE RESULTING PRINTED CIRCUIT BOARD

This application is a divisional of U.S. patent application Ser. No. 10/667,631 filed Sep. 22, 2003 now abandoned entitled "Method for Forming a Back-Drilled Plated Through Hole in a Printed Circuit Board and the Resulting Printed Circuit Board" by Joseph Smetana Jr.

BACKGROUND OF THE INVENTION

1. Field of the Invention

The present invention relates in general to a method for forming a back-drilled plated through hole in a printed circuit board and the resulting printed circuit board.

2. Description of Related Art

Designers and manufacturers of printed circuit boards are constantly trying to develop new and better methods to make printed circuit boards. For instance, the designers and manufacturers have been trying to develop a new and better method to form back-drilled plated through holes in printed circuit boards. A traditional method for forming back-drilled through holes in a printed circuit board is described in detail below with respect to FIGS. 1A-1D.

Referring to FIGS. 1A-1D, there are shown partial cross-sectional side views of a traditional printed circuit board 100 at different stages during the formation of a back-drilled plated through hole 102. The exemplary multi-layered printed circuit board 100 shown has six stacked material insulator layers (typically laminates and prepregs) 104a, 104b . . . 104f separating five internal layers 105a, 105b . . . 105e and two external layers 108a and 108b. Internal layers 105a, 105b and 105e are signal layers. And, internal layers 105c and 105d are plane layers.

In the first step to form the back-drilled plated through hole 102 in printed circuit board 100, a pilot hole 106 (e.g., first hole 106) having a diameter d1 is drilled through the printed circuit board 100 (see FIG. 1A). In an illustrative example, the thickness of the printed circuit board 100 is 0.23" and the diameter d1 of the pilot hole 106 is 0.030-0.032". Secondly, the walls of the pilot hole 106 and predetermined areas 108a and 108b on the surfaces 110a and 110b of the printed circuit board 100 are plated with a thin layer of conductive material 112 (e.g., copper) (see FIG. 1B). In the illustrative example, the diameter d2 of the plated pilot hole 104 is 0.026". Thirdly, a drill 114 having diameter d3 is used to back-drill concentrically around and through a predetermined depth of the plated pilot hole 106 (see FIG. 1C). In the illustrative example, the drill 114 has a diameter d3 in the range of 0.040-0.045" and is shown going through stacked layers 104d, 104e and 104f. Fourthly, the drill 114 is removed from the printed circuit board 100 which now has a via 116 formed therein that includes the plated through hole 102 and a back-drilled hole 118 (see FIG. 1D).

The traditional method for forming the back-drilled plated through hole 102 in the printed circuit board 100 has a major drawback because of a registration tolerance requirement that requires the back-drilled hole 118 to have a diameter d3 that is much larger than the diameter d1 of the pilot hole 106. In particular, the registration tolerance requirement demands that the drill 114 used to make the back-drilled hole 118 have a diameter d3 that is at least 0.010" larger than a diameter of the drill (not shown) used to make the pilot hole 106. This means that the diameter of the back-drilled hole 118 is a lot larger than the diameter of the plated through hole 102 which negatively impacts the clearance requirements for signal trace(s) 105e and ground plane(s) 105d in the back-drilled layers and associated material insulator layers 104d, 104e and 104f. Accordingly, there is a need for a new way to form a back-drilled pilot through hole in a printed circuit board that overcomes the aforementioned shortcoming of the traditional back-drilled method. This need and other needs are satisfied by the method and printed circuit board of the present invention.

BRIEF DESCRIPTION OF THE INVENTION

The present invention includes a method for forming a back-drilled plated through hole in a printed circuit board and the resulting printed circuit board. The preferred method for forming a plated through hole in a multi-layered printed circuit board includes the following steps: (1) drilling a first hole (e.g., pilot hole) having a first diameter through the printed circuit board; (2) drilling a second hole having a second diameter concentrically around and through a pre-determined depth of the first hole in the printed circuit board; (3) plating the second hole and a remaining portion of the first hole in the printed circuit board; and (4) back-drilling a third hole having a third diameter that is substantially the same size (or may be smaller—depending on the size of the pilot hole) as the second hole concentrically around and through the remaining portion of the plated first hole to remove the plated first hole and leave the plated second hole which forms the plated through hole in the printed circuit board.

BRIEF DESCRIPTION OF THE DRAWINGS

A more complete understanding of the present invention may be obtained by reference to the following detailed description when taken in conjunction with the accompanying drawings wherein:

FIGS. 1A-1D (PRIOR ART) are partial cross-sectional side views of a traditional printed circuit board at different stages during the formation of a back-drilled plated through hole;

DETAILED DESCRIPTION OF THE DRAWINGS

Figure 2:
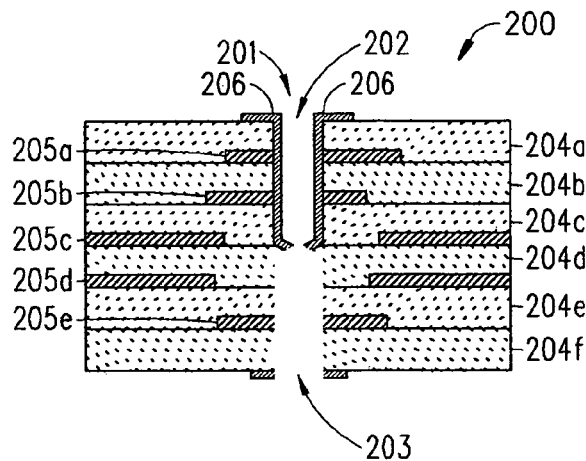
FIG. 2 is a partial cross-sectional side view of a printed circuit board in accordance with the present invention.
Figure 3:
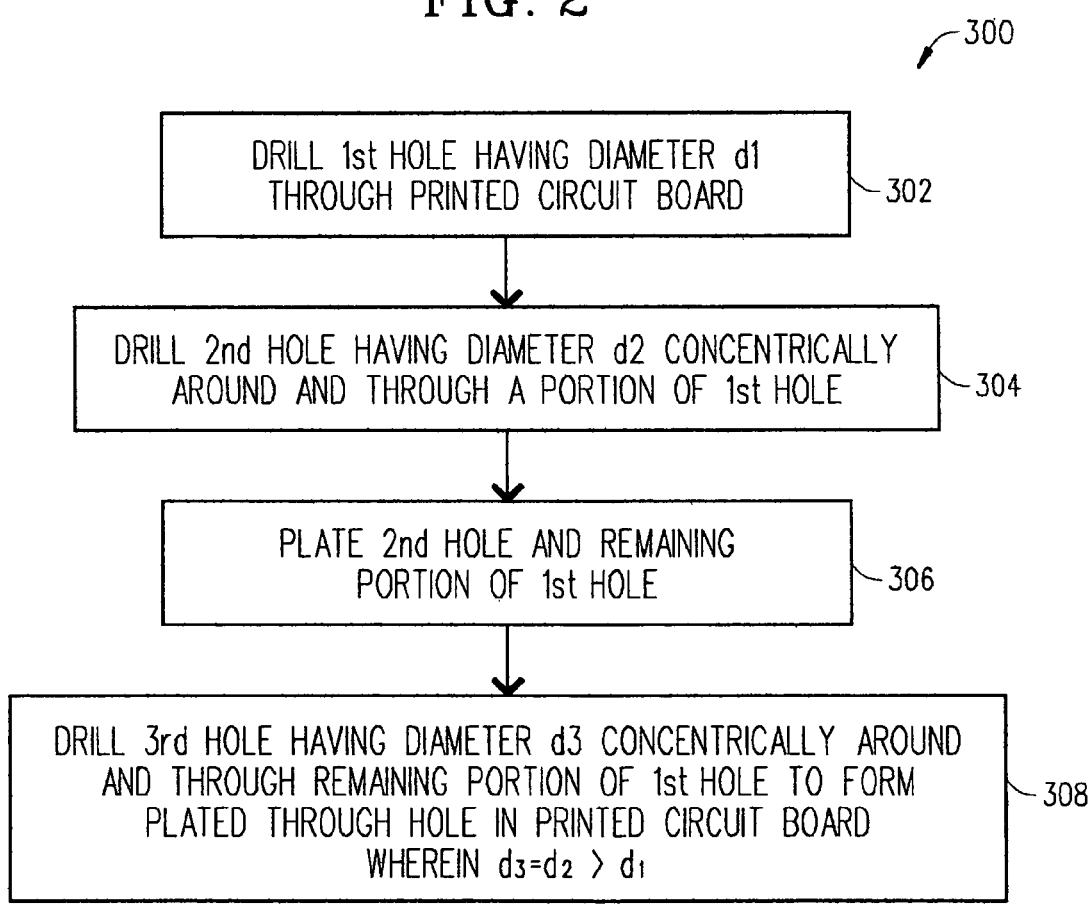
FIG. 3 is a flowchart illustrating the steps of the preferred method for forming a plated through hole in the printed circuit board shown in FIG. 2.

Referring to FIGS. 2-4, there is disclosed a preferred embodiment of a printed circuit board 200 and a preferred method 300 for making the printed circuit board 200. Although the printed circuit board 200 is described herein as having only one plated through hole 202. It should be appreciated that only one plated through hole 202 is shown for simplicity of illustration and that the printed circuit board 200 is likely to have a relatively large number of plated through holes 202.

Referring to FIG. 2, there is shown a partial cross-sectional side view of the printed circuit board 200 in accordance with the present invention. The printed circuit board 200 is described herein as having six stacked material insulator layers (typically laminates and prepregs) 204a, 204b ... 204f separating five internal layers 205a, 205b ... 205e and two external layers 408a and 408b. Internal layers 205a, 205b and 205e are signal layers. And, internal layers 205c and 205d are plane layers. It should be appreciated that the number of material insulator layers 204a ... 204f and signal or plane layers 205a ... 205e shown in the printed circuit board 200 is selected for simplicity of illustration and that the number of layers is not a limitation on the invention.

The printed circuit board 200 includes a via 201 extending through the stacked material insulator layers 204a ... 204f and signal or plane layers 205a ... 205e. The via 201 includes the plated through hole 202 and a back-drilled hole 203. The plated through hole 202 is located within a predetermined number of stacked material insulator layers 204a ... 204c and signal layers 205a and 205b. And, the back-drilled hole 203 is located within the remaining stacked material insulator layers 204d ... 204f and signal or plane layers 205c ... 205e. As can be seen, the plated through hole 202 without an electrically conductive material 206 plated on the walls therein has a diameter that is substantially the same size (shown) or smaller than the diameter of the back-drilled hole 203. Detailed discussions about the advantages of having a back-drilled hole 203 with a diameter that is substantially the same size or smaller than the diameter of the plated through hole 202 and about how the printed circuit board 200 can be made are provided below with respect to FIGS. 3-4.

Referring to FIGS. 3 and 4, there are respectively shown a flowchart of a preferred method 300 for forming the plated through hole 202 in the printed circuit board 200 and various partial cross-sectional side views of the printed circuit board 200 at different stages in the preferred method 300. Beginning at step 302, a pilot hole 402 (e.g. first hole 402) having a first diameter d1 is drilled through the printed circuit board 200 (see FIG. 4A). In an illustrative example, the thickness of the printed circuit board 200 is 0.23" and the diameter d1 of the pilot hole 402 is 0.020". It should be appreciated that the size of the pilot hole 402 and, in particular, how small one can make the pilot hole 402 is a function of the plate-ability/aspect ratio of the printed circuit board 200.

Figure 4A:
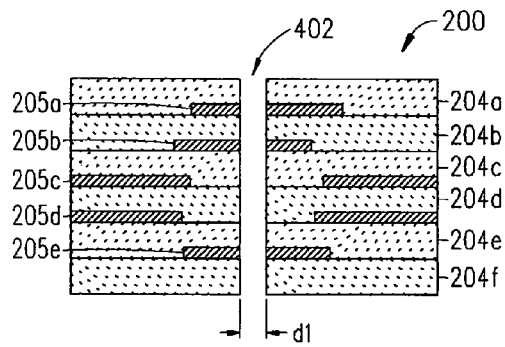
FIGS. 4A-4E are partial cross-sectional side views of a printed circuit board at different stages during the formation of a back-drilled hole in accordance with the preferred method shown in FIG. 3.
Figure 4B:
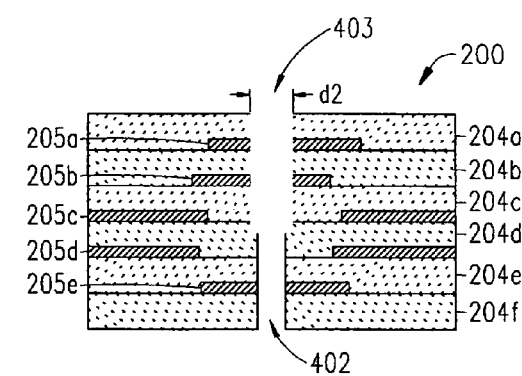
Figure 4C:
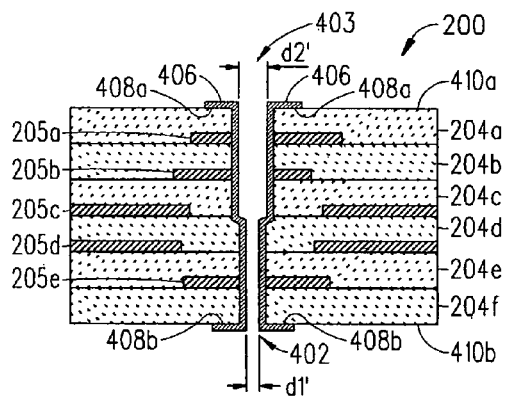

At step 304, a second hole 403 having a second diameter d2 is drilled concentrically around and through a predetermined depth of the pilot hole 402 (see FIG. 4B). In the illustrative example, the diameter d2 of the second hole 403 which is shown within stacked material insulator layers 204a ... 204c is 0.030-0.031".

At step 306, the walls of the remaining portion of the pilot hole 402 and the walls of the second hole 403 are plated with a thin layer of a conductive material 406 (e.g., copper). In addition, predetermined areas 408a and 408b on the surfaces 410a and 410b of the printed circuit board 200 are plated with a thin layer of the conductive material 406 (e.g., copper) (see FIG. 4C). In the preferred embodiment, an electroless plating process and then an elecrolytic process can be used to apply the conductive material 406 on the walls of the remaining pilot hole 402 and the second hole 403 and on the predetermined areas 408a and 408b of the printed circuit board 200. In the illustrative example, the diameter d1' of the plated pilot hole 402 is 0.016" and the diameter d2' of the plated second hole 403 is 0.026".

Figure 4D:
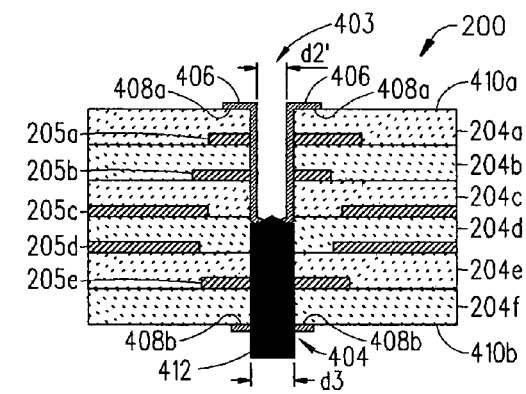
Figure 4E:
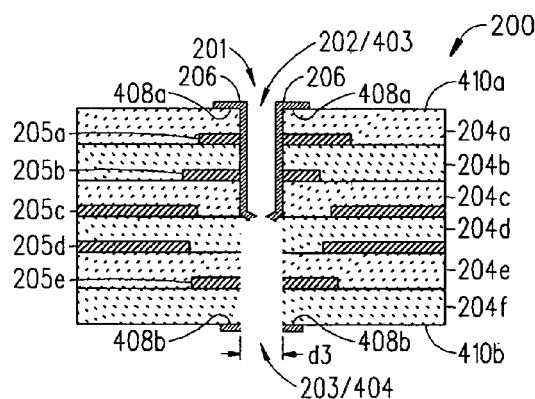

At step 308, a drill 412 having diameter d3 is used to back-drill and form a third hole 404 concentrically around and through the remaining portion of the plated pilot hole 402 starting from surface 410b of the printed circuit board 200 (see FIG. 4D). Then the drill 412 is removed from the printed circuit board 200 which now has the via 201 formed therein that includes the pilot through hole 202 (e.g., plated second hole 403) and the back-drilled hole 203 (e.g., third hole 404) (see FIGS. 2 and 4E). In the illustrative example, the diameter d3 of the drill 412 is in the range of 0.030-0.035". It should be noticed that the diameter d3 of the drill 412 is typically at least 0.010" larger (the exact number is dependent on a fabricator's registration capabilities) than diameter d1 of the pilot hole 402. This is because of the aforementioned registration tolerance requirement which is applicable to method 300 like it was to the traditional method for back-drilling the printed circuit board 100. It should be appreciated that diameter d2 does not have to equal diameter d3 as shown but could be smaller or larger, but rarely will be larger, depending on the size of the first hole 402 (e.g., pilot hole 402) and other considerations—such as the plating aspect ratio.

In comparing the traditional printed circuit board 100 shown in FIG. 1C to the printed circuit board 200 shown in FIG. 4D, it is apparent that the diameters of the printed through holes 102 and 202 are the same but the diameters of the back-drilled holes 118 and 203 are different. The diameter d3 of the back-drilled hole 118 in the traditional printed circuit board 100 is larger than the diameter d3 of the back-drilled hole 203 in the printed circuit board 200. In the illustrative examples, the diameters of the printed through holes 102 and 202 are 0.026" and the diameters of the back-drilled holes 118 and 203 are respectively 0.040-0.045" and 0.030-0.035". Thus, the printed circuit board 200 has a back-drilled hole 203 that is 0.010" smaller than the back-drilled hole 118 in the traditional printed circuit board 100. This leads to several advantages as follows:

There is more room to route traces in the back-drilled layer 205e.

There is more room so one can use wider traces in the back-drilled layer 205e.

There can be smaller openings in the back-drilled plane layers 205c and 205d.

The back-drilled plane layers 205c and 205d can be more continuous.

One can increase the electrical air-gap distance between adjacent plated through holes 202 on outer layers which reduces the likelihood of having lighting strikes between plated through holes 202.

All of these advantages help improve the signal integrity and the electromagnetic interference (EMI) performance of the printed circuit board 200.

It should be appreciated that the plated pilot hole 402 is back-drilled by drill 412 because it is considered a resonant stub and can cause undesirable reflections at certain frequencies if it was not removed from the printed circuit board 200. It should also be appreciated that the plated through hole 202 extends within the printed circuit board 200 deep enough so that when a pin (not shown) of a component (not shown), if required, is inserted into the plated through hole 202 then the pin is electrically interconnected with signal traces 205a and 205b within material insulator layers 204a and 204b. Moreover, it should also be appreciated that method 300 can be used to form back-drilled pilot holes 202 in any multi-layer printed circuit board 200. For instance, the printed circuit board 200 can be a high-speed backplane like Alcatel's Litespan 7201 backplane.

Although one embodiment of the present invention has been illustrated in the accompanying Drawings and described in the foregoing Detailed Description, it should be understood that the invention is not limited to the embodiment disclosed, but is capable of numerous rearrangements, modifications and substitutions without departing from the spirit of the invention as set forth and defined by the following claims.

What is claimed is:

1. A method for forming a plated through hole in a multi-layered printed circuit board, said method comprising the steps of:
   drilling a first hole having a first diameter through said printed circuit board;
   drilling a second hole having a second diameter concentrically around and through a predetermined depth of said first hole in said printed circuit board;
   plating said second hole and a remaining portion of said first hole in said printed circuit board; and
   back-drilling a third hole having a third diameter concentrically around and through the remaining portion of said plated first hole to remove that portion of said plated first hole and leave said plated second hole which forms the plated through hole in said printed circuit board.

2. The method of claim 1, wherein said second diameter of said second hole is substantially the same size or smaller than said third diameter of said third hole.

3. The method of claim 1, wherein said step of plating includes applying a layer of conductive material on walls of said second hole and on walls of the remaining portion of said first hole and on predetermined areas on a top surface and bottom surface of said printed circuit board.

4. The method of claim 1, wherein said printed circuit board has a plurality of said plated through holes formed therein.

* * * * *